United States Patent [19]

Moser

[11] Patent Number: 5,262,587
[45] Date of Patent: Nov. 16, 1993

[54] CLAMPING ELEMENT FOR HOLDING ELECTRONIC CARDS

[75] Inventor: Günter Moser, Feldkirchen, Fed. Rep. of Germany

[73] Assignee: Messerschmitt-Bolkow-Blohm GmbH, Munich, Fed. Rep. of Germany

[21] Appl. No.: 748,108

[22] Filed: Aug. 21, 1991

[30] Foreign Application Priority Data

Sep. 4, 1990 [DE] Fed. Rep. of Germany ....... 4028003

[51] Int. Cl.⁵ ............................................. H05K 7/20
[52] U.S. Cl. .................................. 174/15.1; 361/711; 403/409.1
[58] Field of Search ............... 174/15.1; 361/381, 386, 361/388; 403/409.1

[56] References Cited

U.S. PATENT DOCUMENTS

| | | | |
|---|---|---|---|
| 4,298,904 | 11/1981 | Koenig | 361/386 |
| 4,318,157 | 3/1982 | Rank et al. | 361/388 X |
| 4,354,770 | 10/1982 | Block | 361/415 X |
| 4,414,605 | 11/1983 | Chino et al. | 361/388 |
| 4,480,287 | 10/1984 | Jensen | 361/388 |
| 4,701,829 | 10/1987 | Bricaud et al. | 361/386 |
| 4,751,963 | 6/1988 | Bui et al. | 361/386 X |
| 4,819,713 | 4/1989 | Weisman | 361/388 X |
| 4,909,752 | 3/1990 | Hallum | 361/388 X |

FOREIGN PATENT DOCUMENTS

| | | | |
|---|---|---|---|
| 0289686 | 11/1988 | European Pat. Off. | 361/386 |
| 3202271A1 | 7/1983 | Fed. Rep. of Germany . | |
| 3245072A1 | 6/1984 | Fed. Rep. of Germany . | |
| 3522124A1 | 1/1987 | Fed. Rep. of Germany . | |
| 3732346C2 | 9/1989 | Fed. Rep. of Germany . | |

OTHER PUBLICATIONS

Dieter van Leyen Wärmeübertragung published by Siemens Aktiengesellschaft, 1971 p. 267.

Primary Examiner—Leo P. Picard
Assistant Examiner—David A. Tone
Attorney, Agent, or Firm—McGlew and Tuttle

[57] ABSTRACT

The present invention pertains to a clamping element for holding electronic boards inserted in parallel to one another into an electronic rack. The arrangement removes waste heat from the electronic boards to the rack housing by heat conduction and via heat exchangers. A clamping element is proposed for this purpose, which substantially reduces the thermal resistance and consequently the temperature difference caused by heat conduction between the electronic board and the housing rack, and which also permits variable, defined adjustable clamping forces, and which is designed as an optical clamping control indicator.

7 Claims, 3 Drawing Sheets

A,B: DIRECTIONS OF MOVEMENT DURING SHORTENING OF THE SCREW DUE TO TURNING

CLAMPING ELEMENT FOR HOLDING ELECTRONIC CARDS

FIELD OF THE INVENTION

The present invention pertains to a clamping element for holding electronic cards inserted in parallel to one another in an electronic rack wherein waste heat is removed from the electronic boards to a rack housing by cooling via heat exchangers.

BACKGROUND OF THE INVENTION

Such clamping elements have been known in vastly different embodiments and for vastly different tasks. For example, a tensioning element, which is not only able to hold electronic boards of varying size in a vibration-free flat position, but also guarantees vibration-free mounting in the case of arrangement of the tensioning elements in empty places of the board, has become known from German Patent Specification No. DE-PS 37,32,346. To achieve this, a concept has been created in which a U-shaped guide rail is provided for receiving via a holding eye arranged in its center and a clamping element pulled through this eye. This embodiment has proved to serve its purpose well, but is far too inefficient in terms of its thermal conductivity in the housing rack, which is force-cooled by so-called heat exchangers (cold plates), especially at the interfaces between the electronic board and the wall of the rack housing.

Commercially available clamping element designs provide for various mechanical clamp forms between electronic boards and housing racks, e.g., clamping clips made of spring steel, which are inserted into the correspondingly shaped board holding groove of the cold plate. The heat transfer from the board to the housing wall is also accomplished by these spring clips.

Furthermore, so-called eccentric clamping devices have also been known, in which a small spring plate and an eccentric element press the web of the electronic board, thus establishing the connection and heat conduction between the board and the heat exchange wall. Aside from the fact that a special processing of the cold plate is necessary only for the mounting of the eccentric and the spring in this case as well, the heat dissipation is also much lower.

Further heat-conducting clamping elements of complicated design, which are provided with separate control members or additionally coupled components, have been known from German Offenlegungsschriften Nos. DE-OS 35,22,124 and DE-OS 32,45,072.

All these prior-art embodiments have a number of disadvantages. For example, longitudinal flow of the coolant takes place in the cold plates or heat exchangers, which leads to different temperatures within the rack and to decreasing cooling capacity from one electronic board to the next, because the coolant is being continuously heated by the addition of heat (FIG. 1).

However, the prior-art clamping elements are also insufficient for adequate heat conduction or dissipation due to their relatively small, only linear or punctiform contact areas or cross-sectional areas. In addition, the clamping force, which is essential for the thermal resistance over the pressed contact surfaces, is usually subject to great tolerances, so that a uniform, defined clamping force can be set only by means of special measuring devices, torque wrenches, etc.

SUMMARY AND OBJECTS OF THE INVENTION

It is the object of the present invention to provide a clamping element of the above-described class, in which the above-mentioned disadvantages are practically completely eliminated, and the resistance to heat conduction and thus the temperature difference between the electronic board and the housing rack, which is established by the heat conduction, is substantially reduced, and which allows a definite setting of the clamping force which can also be determined optically.

According to the invention, a clamping element arrangement is provided for holding electronic boards inserted in parallel to one another in an electronic rack. The clamping element includes a tensioning part with a tensioning device and at least two trapezoidal clamping part blocks. The tensioning part and the clamping part blocks have lateral surfaces (when viewed in cross section) of which one side surface extends at right angles to the clamping element surface and to a clamping element underside. The underside surface extends at an angle, essentially trapezoidally from top to bottom. The clamping element together with the electronic board is inserted into a groove defined by the electronic rack housing (cold plate) provided with integrated cooling ducts. The grooves are correspondingly trapezoidal, having an angled surface on one side and the tensioning device is designed as a clamping force indicator. The clamping part blocks (of which there are at least two) are made of a solid material with good thermal conductivity. This may be aluminum or duralumin. The spring assemblies of the tensioning device together with a hexagonal recessed head of a tightening screw and blind holes of segments of the tensioning part indicate the existing clamping force by markings (clamping force indicating means). The cooling canals for an air or liquid medium or heat pipes are arranged in parallel with the grooves in the remaining webs of the electronic rack housing.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DETAILED DESCRIPTION OF THE PREFERRED EMBODIMENT

Figure 1:
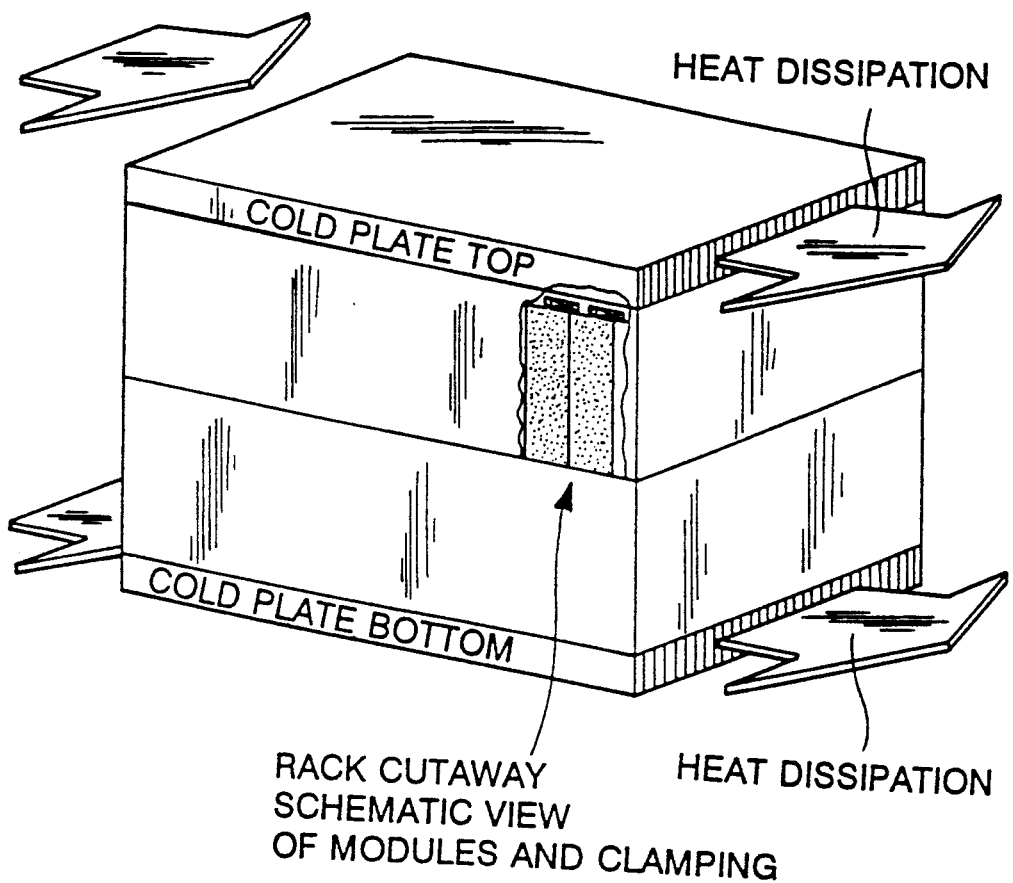
FIG. 1 is a perspective view of an electronic box (rack) with conventional clamping device and heat exchanger for cooling air such a cold plate according to the state of the art.
Figure 4:
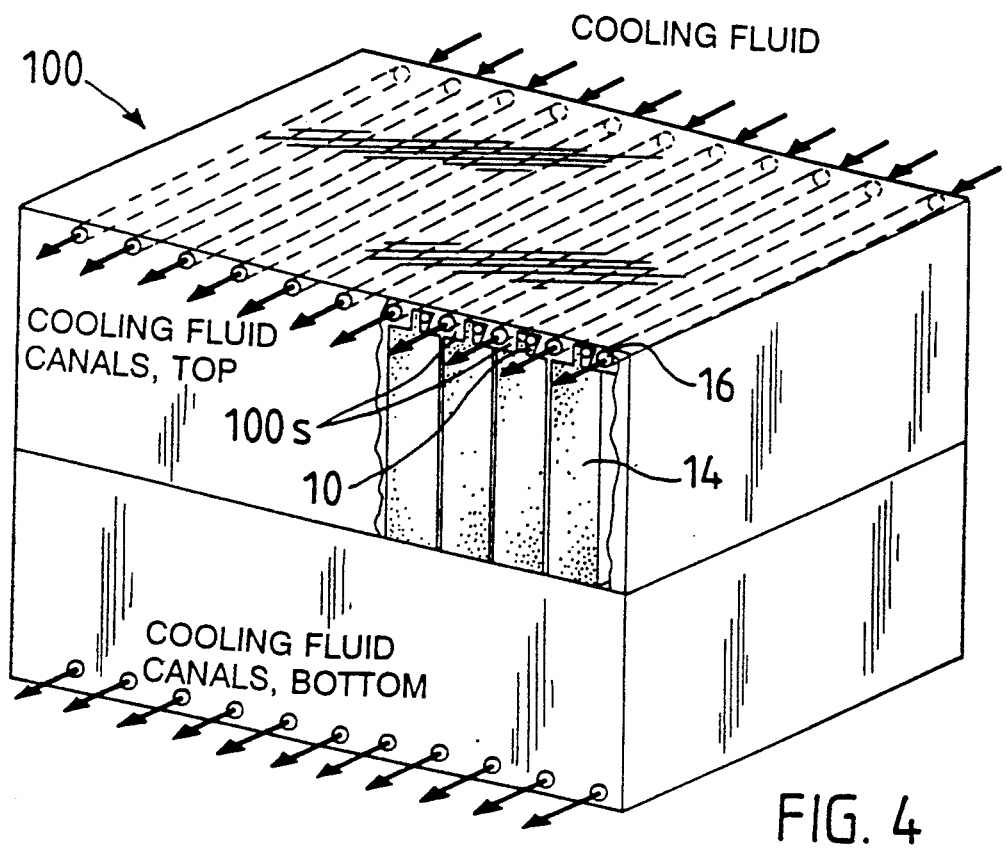
FIG. 4 is a perspective view of a housing box (rack) with the double wedge clamping element and integrated coolant canals according to the invention.

While FIG. 1 shows a housing unit according to the state of the art, through which the coolant stream flows longitudinally, FIG. 4 shows a housing rack design with forced cross-flow cooling and double wedge clamping of the electronic board (according to the invention), which will be described below.

Figure 2:
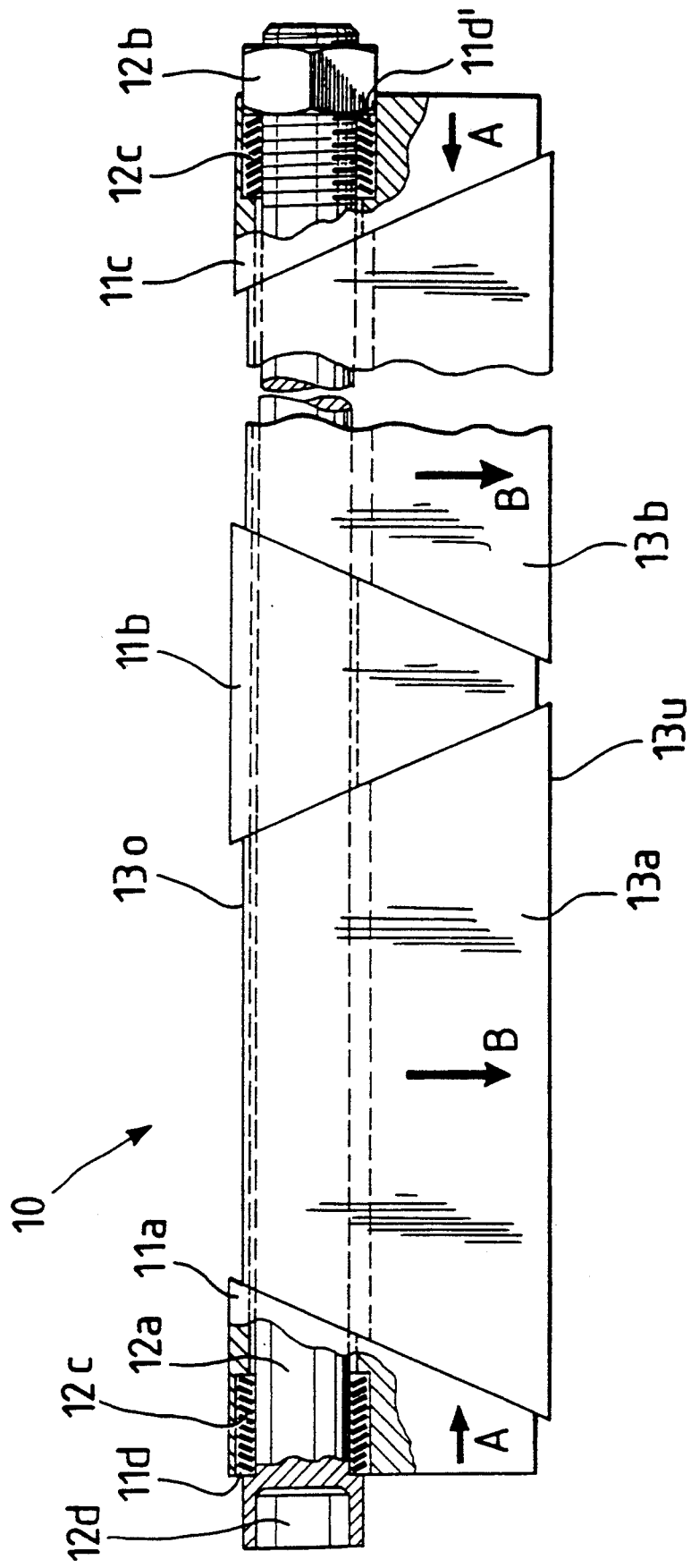
FIG. 2 is a partially cutaway longitudinal view of an embodiment of the clamping element design according to the present invention.

FIG. 2 shows an embodiment for the above-mentioned double wedge clamping of a clamping element 10, which is composed of a tensioning part (wedges) 11a, 11b, 11c with a tensioning device (tension bolt, nuts and springs) 12a, 12b, 12c, and at least two trapezoidal clamping part blocks 13a, 13b. The tensioning part is formed by a receiving segment 11a for the tightening screw 12a and an end support segment 11c for said tightening screw 12a. Between these two segments 11a, 11c, which have conically opposingly extending end faces, a conically shaped sliding segment 11b is arranged, which is provided with a bore for said tightening screw 12a. Each of said segments 11a, 11c is provided with a blind hole 11d, in which the hexagonal screw head 12d or the hexagonal screw nut 12b and a spring assembly 12c each are mounted.

When said continuous screw 12a is turned in, it becomes "shorter" as a consequence of said nut 12b, mounted nonrotatably. The force applied, which is "damped" by said springs 12c, displaces said clamping part blocks 13a, 13b at the trapezoidally extending contact surfaces in the direction of arrow B shown, vertically in the downward direction, until they come into contact with the likewise wedge-shaped groove wall 15a of the webs 100s provided in the "cold plate" or electronic rack housing 100. This is clearly apparent from FIG. 3. Due to the downward movement of said clamping part blocks 13a, 13b, said web 14' of said electronic board 14 is pressed against the vertical wall of said web 100s.

Since said clamping web blocks 13a, 13b, of which there are at least two, establish the direct contact with the electronic board and said electronic rack housing 100, and also have large contact surfaces, they are made of a material with good thermal conductivity, e.g., aluminum or duralumin, in order to thus make them optimal for heat dissipation as well. For reasons related to design and general principles, only the direct contact surface between the electronic board and the rack housing has so far been able to be used as a heat-dissipating surface in clamping devices, because the clamping device itself presented an excessively high thermal resistance to heat dissipation from said electronic board 14. However, the thermal resistance of the clamping device has now been reduced due to the large contact surfaces 13' and 13" of said clamping part blocks 13a, 13b, and the heat-transmitting contact surfaces have been increased.

By arranging at least two clamping part blocks 13a, 13b, tolerances of the clamping geometry are compensated, and homogeneous clamping forces over the entire clamping length are achieved. Since the pressing forces acting on the heat-transmitting transmitting contact surfaces 13', 13" are determined by the pressing forces transmitted via the spring assemblies 12c, preferably plate springs made of steel or plastic, it is possible to dimension these spring assemblies 12c to be such that the actually desired or necessary clamping force is indicated by markings—for example, on the hexagonal screw head or the blind hole associated with it—and said hexagonal tightening screw 12a thus serves at the same time as a clamping force indicator.

Another possibility for achieving this is that, e.g., the correct clamping force between said electronic board 14 and said housing rack 100 is reached precisely when the hexagonal head of said tightening screw 12a, which may be colored if desired, is flush with the edge of said blind hole 11d when viewed from the outside. This makes it unnecessary to use special tools, such as torque wrenches, etc., to apply a defined, uniform clamping force. The state brought about with defined, uniform clamping force is optically visible immediately and at any time, and any dimensional change in clamping geometry during operation—e.g., due to vibration—is compensated for by the effect of said spring assemblies 12c.

The concept of a double wedge or multiple wedge clamping according to the present invention also offers the special advantage that no mounting on either said electronic board 14 or said housing rack 100 or cold plate is required. The above-described clamping element 10 may be introduced as a separate element into the corresponding space of said groove 15 after insertion of said electronic board 14. The oblique groove surface of said webs 100s holds said clamping element 10 in its correct position even in the nonclamped state.

Figure 3:
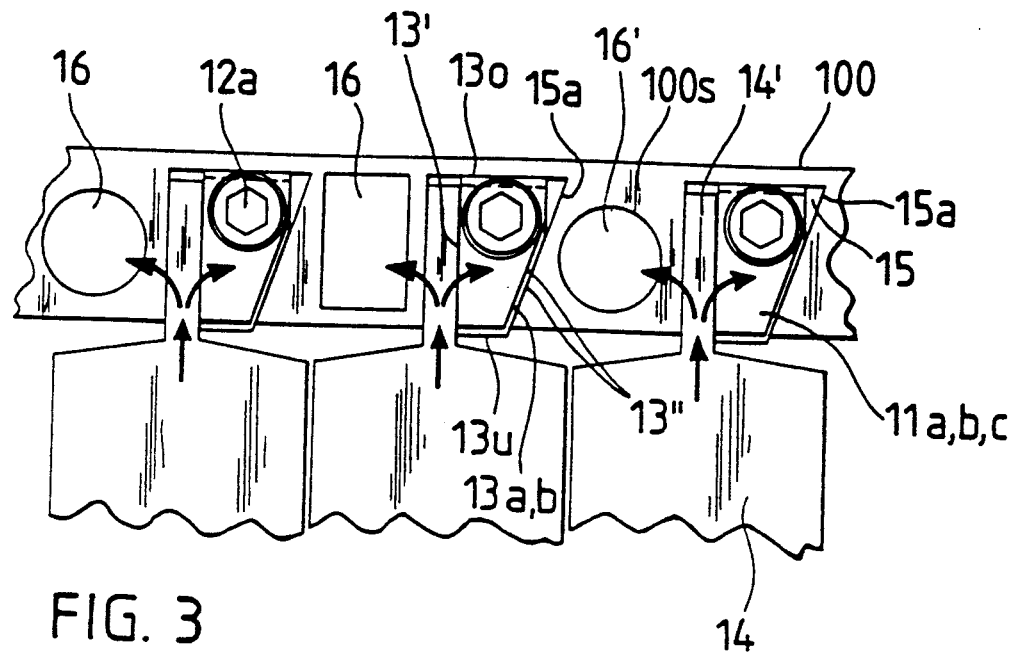
FIG. 3 is a partial detail of clamping sites of the electronic boards in the electronic rack according to FIG. 4 on a larger scale.

As is apparent from FIG. 3, it is possible, in the case of corresponding sizes, to provide said webs 100s of said electronic housing rack 100 or the cold plate with cooling canals 16 for air or liquid or with so-called heat pipes 16'. This leads to overall reductions of the volume and weight of said housing rack 100, because said cooling canals, whose totality forms the cold plate, are now locally integrated in the clamping webs, and are not separated, as in FIGS. 1 and 4. However, the double wedge or multiple wedge clamping proposed is also particularly advantageous in the cold plate designs according to FIG. 1 especially in terms of heat dissipation, because the longitudinal flow through the housing rack is replaced with cross flow due to the change in the direction of flow in the case of fluid cooling. This causes all said electronic boards 14 to have nearly the same cooling fluid temperatures as the boundary conditions for cooling. In the case of the previous longitudinal flow, constantly increasing cooling fluid temperatures are obtained for the boards located in the flow direction, because the temperatures of the fluid or medium add up from one board to the next. The cross-sectional shape of said canals 16, 16' is selected primarily as a function of the manufacturing costs and the volume of said webs 100s.

While a specific embodiment of the invention has been shown and described in detail to illustrate the application of the principles of the invention, it will be understood that the invention may be embodied otherwise without departing from such principles.

What is claimed is:

1. A clamping element arrangement for holding electronic cards inserted in parallel to one another in an electronic rack, comprising:

an electronic rack housing including a plurality of webs, individual webs being separated from adjacent webs by one of a plurality of grooves, said electronic rack housing including cooling duct means for heat transfer with said webs, webs on each side of a groove defining a groove surfaces including an angle side cooperating with other surfaces to define a groove trapezoidal shape in cross section; a tensioning nut bolt assembly positioned in said groove and extending over a portion of a length of said groove; a first tensioning part connected at one end of said tensioning nut bolt assembly for axial movement with respect to said tensioning nut bolt assembly and a second tensioning part connected at another end of said tensioning nut bolt assembly for axial movement with respect to said tensioning nut bolt assembly, each of said first tensioning part and said second tensioning part having a centrally facing end surface, angled with respect to said tensioning nut bolt assembly, two trapezoidal clamping part blocks positioned between said first tensioning part and said second tensioning part and an additional tensioning part positioned between said trapezoidal clamping part blocks, said trapezoidal clamping part blocks having angled end faces and lateral surfaces, viewed in cross section with one of said lateral surfaces extending at a right angle with respect to a base surface of each tensioning part and another of said lateral surfaces extending substantially at an angle with respect to said base surface to define a substantially trapezoidal shape for bearing against said angle side of said web; tension application means including spring means acting on said tensioning part, said tension application means including said nut bolt assembly for altering a force applied by said spring on said tensioning part, said tension application means including means for indicating a force applied by said spring means, said force acting on said tensioning parts causing said tensioning parts to be urged together, urging said trapezoidal clamping part blocks radially outwardly with respect to said tensioning nut bolt assembly and urging said lateral surface extending at a right angle toward a surface of said web opposite said angle side.

2. A clamping element according to claim 1, wherein said trapezoidal clamping part blocks are formed of a solid material with high thermal conductivity.

3. A clamping element arrangement according to claim 2, wherein said material is one of aluminum and duralumin.

4. A clamping element according to claim 1, wherein said cooling ducts comprise one of cooling canals for air or liquid medium and heat pipes, said cooling ducts being arranged in parallel with said grooves of said electronic rack housing.

5. A clamping element arrangement for holding electronic cards inserted in parallel to one another in an electronic rack, comprising:
an electronic rack housing including a plurality of downwardly extending webs, each web being separated from adjacent webs by one of a plurality of grooves, said electronic rack housing including cooling duct means including a duct extending through each web parallel to said grooves for heat transfer with said webs, said webs defining surfaces of said grooves including an angle side surface cooperating with other surfaces to define a groove trapezoidal shape in cross section; a clamping element positioned in said groove and extending over a portion of a length of said groove including a first tension part connected at one end of said clamping element of axial movement with respect to said clamping element and a second tension part connected to another end of said clamping element for axial movement with respect to said clamping element, each of said tension parts having a centrally facing end surface, angled with respect to said clamping element, two trapezoidal clamping part blocks positioned between said tensioning parts and an additional tensioning part positioned between said trapezoidal clamping part blocks, said trapezoidal clamping part blocks having angled faces and lateral surfaces, viewed in cross section with one of said lateral surfaces extending at a right angle with respect to base surface of each tensioning part and another of said lateral surfaces extending substantially at an angle with respect to said base surface to define a substantially trapezoidal shape for bearing against said angle side of said web, tension application means including spring means acting on said tensioning part, said tension application means including means for indicating a force applied by said spring means for altering a force applied by said spring on said tensioning part, said force acting on said tensioning part causing said tensioning parts to be urged together, urging said trapezoidal clamping part blocks radially outwardly with respect to said clamping element and urging said lateral surface extending at a right angle toward a surface of said web opposite said angle side.

6. A clamping device arrangement according to claim 5, wherein said tensioning application means includes a spring assembly cooperating with a hexagonal recesses head and a tightening screw, said tensioning part including a blind hole from said recessed head indicating clamping force with respect to said tensioning part by markings on one of said tensioning part and said recessed head.

7. A clamping element arrangement for holding electronic cards inserted in parallel to one another in an electronic rack, comprising:
an electronic rack housing including a plurality of webs, individual webs being separated from adjacent webs by one of a plurality of grooves, said electronic rack housing including cooling duct means including a duct extending through each web parallel to said grooves for heat transfer with said webs, webs on each side of a groove defining groove surfaces including an angle side cooperating with other surfaces to define a groove trapezoidal shape in cross section; a tensioning nut bolt assembly positioned in said groove and extending over a portion of a length of said groove; a first tensioning part connected at one end of said tensioning nut bolt assembly for axial movement with respect to said tensioning nut bolt assembly and a second tensioning part connected at another end of said tensioning nut bolt assembly for axial movement with respect to said tensioning nut bolt assembly, each of said first tensioning part and said second tensioning part having a centrally facing end surface, angled with respect to said tensioning nut bolt assembly; two trapezoidal clamping part blocks, formed of solid aluminum or duralumin, positioned between said first tensioning part and said second tensioning part and an additional tensioning part positioned between said trapezoidal clamping part blocks, said trapezoidal clamping part blocks having angled end faces and lateral surfaces, viewed in cross section with one of said lateral surfaces extending at a right angle with respect to a base surface of each tensioning part and another of said lateral surfaces extending substantially at an angle with respect to said base surface to define a substantially trapezoidal shape for bearing against said angle side of said web; tension application means including spring means acting on said tensioning part and for altering a force applied by said spring on said tensioning part, said tension application means including means for indicating a force applied by said spring means, said force acting on said tensioning part causing said tensioning parts to be urged together, urging said trapezoidal clamping part blocks radially outwardly with respect to said tensioning nut bolt assembly and urging said lateral surface extending at a right angle toward a surface of said web opposite said angle side.

* * * * *